(12) United States Patent
Sugita et al.

(10) Patent No.: US 8,697,229 B2
(45) Date of Patent: Apr. 15, 2014

(54) HARD COATING FILM AND HARD COATING FILM COATED WORKING TOOL

(75) Inventors: Hiroaki Sugita, Toyokawa (JP); Takaomi Toihara, Toyokawa (JP); Takamasa Suzuki, Toyokawa (JP)

(73) Assignee: OSG Corporation, Toyokawa-shi (JP)

( * ) Notice: Subject to any disclaimer, the term of this patent is extended or adjusted under 35 U.S.C. 154(b) by 557 days.

(21) Appl. No.: 13/054,019

(22) PCT Filed: Jul. 14, 2008

(86) PCT No.: PCT/JP2008/062725
§ 371 (c)(1),
(2), (4) Date: Jan. 13, 2011

(87) PCT Pub. No.: WO2010/007661
PCT Pub. Date: Jan. 21, 2010

(65) Prior Publication Data
US 2011/0117342 A1    May 19, 2011

(51) Int. Cl.
*B32B 7/02* (2006.01)
*B32B 9/04* (2006.01)
*C09C 1/28* (2006.01)
*B23P 15/28* (2006.01)

(52) U.S. Cl.
USPC ........... 428/216; 428/212; 428/699; 428/701; 428/698; 428/704; 51/309; 407/119

(58) Field of Classification Search
USPC ......... 428/212–213, 215–216, 220, 446, 448, 428/600, 602, 627–628, 632–633, 650–656, 428/688–689, 697–699, 701–702, 704; 51/307, 309; 407/119; 416/241 R, 241 B
See application file for complete search history.

(56) References Cited

U.S. PATENT DOCUMENTS
2006/0269789 A1    11/2006   Toihara et al.

FOREIGN PATENT DOCUMENTS
CN          1872536 A       12/2006
DE   10 2006 000 259 A1    12/2006
(Continued)

OTHER PUBLICATIONS
Borisova et al. "Reactions in the Cr-SiC system under conditions of ordinary and plasma heating". Soviet Powder Metallurgy and Metal Ceramics, vol. 18, Issue 10, (1979); pp. 722-728.*
(Continued)

*Primary Examiner* — Prashant J Khatri
(74) *Attorney, Agent, or Firm* — Oliff PLC (57) ABSTRACT

A hard coating film formed on a surface of a predetermined member and having excellent wear resistance and adhesion resistance, the hard coating film includes: a three-layer structure composed of a third layer formed in contact with the surface of the predetermined member, a second layer formed on the third layer, and a first layer formed on the second layer to constitute the surface; the first layer being made of $(Cr_{1-a-b}B_a(SiC)_b)(C_cO_dN_{1-c-d})$ [provided that SiC is silicon carbide, and a, b, c and d are atomic ratios in ranges of $0 \leq a \leq 0.2$, $0.01 \leq b \leq 0.2$, $0 \leq c \leq 0.5$ and $0 \leq d \leq 0.3$, respectively; the second layer being made of AlCrN or AlCrDN [provided that D includes either one kind of elements of a Group IVa, a Group Va and a Group VIa (except Cr) of a Periodic Table of Elements and Y, or SiC (silicon carbide)]; and the third layer being made of nitride, carbon nitride or carbide of metals including elements of one kind or more kinds of Al, Ti, Zr, Hf, V, Nb, Ta, Cr and W.

7 Claims, 6 Drawing Sheets

(56) References Cited

FOREIGN PATENT DOCUMENTS

| | | |
|---|---|---|
| JP | A-2000-308906 | 11/2000 |
| JP | A-2004-017164 | 1/2004 |
| JP | A-2004-034186 | 2/2004 |
| JP | A-2004-269985 | 9/2004 |
| JP | A-2007-002304 | 1/2007 |
| JP | A-2007-015106 | 1/2007 |
| WO | WO2006084404 A1 * | 8/2006 |

OTHER PUBLICATIONS

International Search Report in International Application No. PCT/JP2008/062725; dated Sep. 22, 2008 (w/English-language translation).
May 7, 2013 Office Action issued in German Patent Application No. 11 2008 003 935.6 (with translation).
Jun. 20, 2013 Office Action issued in Chinese Patent Application No. 200880130347.0. (with translation).

* cited by examiner

| TEST PIECE No. | COATING FILM STRUCTURE | | | FILM THICKNESS (μm) | | | | RELIEF-SURFACE WEARING WIDTH(mm) | COATING FILM HARDNESS HV0.025 | DETERMINATION |
|---|---|---|---|---|---|---|---|---|---|---|
| | FIRST LAYER | SECOND LAYER | THIRD LAYER | TOTAL FILM THICKNESS | FIRST LAYER | SECOND LAYER | THIRD LAYER | | | |
| 1 | (Cr0.80B0.15SiC0.05)N | (Al0.65Cr0.25Hf0.1)N | (Ti0.65Al0.3Zr0.05)N | 3.0 | 1(33%) | 1.4(47%) | 0.6(20%) | 0.036 | | ○ |
| 2 | (Cr0.80B0.15SiC0.05)N | (Al0.65Cr0.3SiC0.05)N | (Ti0.45V0.2Cr0.35)N | 1.7 | 0.3(18%) | 1.2(71%) | 0.2(12%) | 0.036 | 3030 | ○ |
| 3 | (Cr0.75B0.08SiC0.17)N | (Al0.63Cr0.27MoC0.1)N | (Ti0.55Al0.35Cr0.1)N | 3.7 | 1.5(41%) | 1.8(49%) | 0.4(11%) | 0.035 | 3170 | ○ |
| 4 | (Cr0.82B0.13SiC0.05)N | (Al0.5Cr0.5)N | (Ti0.55Al0.35Cr0.1)N | 2.5 | 0.5(20%) | 1.6(64%) | 0.4(16%) | 0.029 | 3020 | ○ |
| 5 | (Cr0.80B0.15SiC0.05)N | (Al0.65Cr0.3SiC0.05)N | (Ti0.55Al0.35NbC0.1)N | 2.5 | 0.1(4%) | 2.1(84%) | 0.3(12%) | 0.034 | | ○ |
| 6 | (Cr0.80B0.15SiC0.05)N | (Al0.65Cr0.35)N | (Ti0.6Al0.4)N | 3.1 | 1.4(45%) | 1.4(45%) | 0.3(10%) | 0.023 | 3070 | ○ |
| 7 | (Cr0.80B0.15SiC0.10)N | (Al0.8Cr0.2)N | (Ti0.7Cr0.3)N | 3.0 | 1.5(50%) | 1.2(40%) | 0.3(10%) | 0.028 | | ○ |
| 8 | (Cr0.80B0.05SiC0.15)N | (Al0.55Cr0.35TiC0.1)N | (Ti0.6Cr0.4)N | 2.4 | 1(42%) | 1(42%) | 0.4(17%) | 0.031 | | ○ |
| 9 | (Cr0.80B0.15SiC0.10)N | (Al0.65Cr0.25NbC0.1)N | (Ti0.6Al0.4)N | 2.7 | 0.4(15%) | 1.8(67%) | 0.5(19%) | 0.036 | 3210 | ○ |
| 10 | (Cr0.75B0.15SiC0.1)N | (Al0.65Cr0.35)N | TiN | 3.0 | 0.7(23%) | 2(67%) | 0.3(10%) | 0.041 | 3060 | ○ |
| 11 | (Cr0.78B0.05SiC0.17)N | (Al0.55Cr0.45)N | (Ti0.6Al0.4)N | 2.4 | 1(42%) | 1(42%) | 0.4(17%) | 0.024 | | ○ |
| 12 | (Cr0.82B0.13SiC0.05)N | (Al0.5Cr0.5)N | (Ti0.55Al0.35Cr0.1)N | 2.4 | 0.5(21%) | 1.5(63%) | 0.4(17%) | 0.032 | | ○ |
| 13 | (Cr0.80B0.15SiC0.05)CN | (Al0.65Cr0.35)N | CrN | 3.8 | 1.5(39%) | 1.9(50%) | 0.4(11%) | 0.038 | | ○ |

FIG.2

| TEST PIECE No. | COATING FILM STRUCTURE | | | FILM THICKNESS (μm) | | | | RELIEF-SURFACE WEARING WIDTH(mm) | COATING FILM HARDNESS HV0.025 | DETER-MINATION |
|---|---|---|---|---|---|---|---|---|---|---|
| | FIRST LAYER | SECOND LAYER | THIRD LAYER | TOTAL FILM THICKNESS | FIRST LAYER | SECOND LAYER | THIRD LAYER | | | |
| 1 | (Cr0.80B0.24Si0.05)N | (Al0.5Cr0.5)N | TiN | 3.6 | 1.5(42%) | 1.4(39%) | 0.7(19%) | 0.14 | | × |
| 2 | (Cr0.9B0.1Si)C0)N | (Al0.7Cr0.3)N | CrN | 2.4 | 0.5(21%) | 1.7(71%) | 0.2(8%) | 0.18 | | × |
| 3 | (Cr0.65B0.1SiC0)25)N | (Al0.65Cr0.35)N | (Ti0.5Al0.5)N | 3.2 | 1.3(41%) | 1.8(56%) | 0.1(3%) | 0.15 | | × |
| 4 | — | (Al0.65Cr0.35)N | (Ti0.5Al0.5)N | 2.9 | 0(0%) | 2.6(90%) | 0.3(10%) | 0.23 | | × |
| 5 | (Cr0.80B0.05SiC0.15)N | (Al0.65Cr0.35)N | (Ti0.6Al0.4)N | 3.3 | 1.8(55%) | 1.2(36%) | 0.3(9%) | 0.29 | 2650 | × |
| 6 | (Cr0.80B0.15SiC0.10)N | (Al0.55Cr0.45)N | — | 3.3 | 1(30%) | 2.3(70%) | 0(0%) | 0.15 | | × |
| 7 | (Cr0.82B0.13SiC0.05)N | (Al0.5Cr0.5)N | TiN | 3.2 | 1(31%) | 1.1(34%) | 1.1(34%) | 0.36 | | × |
| 8 | (Cr0.85B0.05SiC0.10)N | (Ti0.55Al0.45)N | — | 1.9 | 0.7(37%) | 1.2(63%) | 0(0%) | 0.23 | 2890 | × |
| 9 | TiN | (Ti0.7Al0.3)N | — | 1.6 | 0.2(13%) | 1.4(88%) | 0(0%) | 0.32 | 2690 | × |
| 10 | (Al0.65Cr0.35)N | (Ti0.55Al0.45)N | — | 2.6 | 0.9(35%) | 1.7(65%) | 0(0%) | CHIPPED | | × |
| 11 | (Al0.55Cr0.45)N | (Al0.65Cr0.35)N | — | 3.8 | 1(26%) | 2.8(74%) | 0(0%) | 0.5 | | × |
| 12 | (Ti0.5Al0.5)N | CrN | — | 2.2 | 1.5(68%) | 0.7(32%) | 0(0%) | 0.48 | 2640 | × |
| 13 | (Cr0.9B0.05SiB.05)N | (Al0.5Cr0.5)N | — | 2.9 | 1.4(48%) | 1.5(52%) | 0(0%) | 0.42 | | × |
| 14 | (Ti0.85SiB.15)N | (Al0.5Cr0.5)N | — | 2.6 | 1.2(46%) | 1.4(54%) | 0(0%) | 0.3 | 2900 | × |

PRESENT INVENTION (CrBSiCN+AlCrN+AlTiN)

FIG.5A

RELATED ART PRODUCT (AlCrN)

FIG.5B

PRESENT INVENTION PRODUCT (CrBSiCN+AlCrN+AlTiN)

FIG.6A

RELATED ART PRODUCT (AlCrN)

FIG.6B

HARD COATING FILM AND HARD COATING FILM COATED WORKING TOOL

TECHNICAL FIELD

The present invention relates to a hard coating film and, more particularly, to improvement of a hard coating film having excellent wear resistance and adhesion resistance.

BACKGROUND ART

Attempts have heretofore been widely made with aims to form a hard coating film on a surface of a predetermined member such as a tool base member (tool base material) or the like which is made of high-speed tool steel and cemented carbide or the like. For instance, in Patent Publication 1, a proposal has been made to form a layer B with excellent adhesion resistance on a layer A having excellent wear resistance. The layer A is made of nitride and carbonitride, etc., of Ti, Cr, Al and Si or the like while the layer B is made of oxide and boronide, etc., of Ti, Cr, Al and Si or the like.
Patent Publication 1: Japanese Patent Application Publication No. 2007-15106

DISCLOSURE OF THE INVENTION

Issue to be Solved by the Invention

With the hard coating film of such a related art, the tool base material or the like could not necessarily have adequate bonding strength. That is, for instance, an issue has been arisen with the occurrence of peel-off or wear due to chipping on early stages with resultant consequence of a deteriorated work surface and a variation in cutting performance when cutting work is performed on stainless steel or when cutting work is performed on a workpiece material which has increased likelihood of adhesion and whose hardness is 50 HRC or less.

SUMMARY OF THE INVENTION

The present invention has been completed with the above view in mind and has an object to allow a hard coating film, having excellent wear resistance and adhesion resistance, to be formed on a tool base material with increased bonding strength for stably obtaining excellent wear resistance and adhesion resistance over a long period of time.

Means for Solving the Problems

To achieve the above object, the first aspect of the present invention provides a hard coating film formed on a surface of a predetermined member and having excellent wear resistance and adhesion resistance, the hard coating film comprising: (a) a three-layer structure composed of a third layer formed in contact with the surface of the predetermined member, a second layer formed on the third layer, and a first layer formed on the second layer to constitute the surface; (b) the first layer being made of $(Cr_{1-a-b}B_a(SiC)_b)(C_cO_dN_{1-c-d})$ [provided that SiC is silicon carbide, and a, b, c and d are atomic ratios in ranges of $0 \le a \le 0.2$, $0.01 \le b \le 0.2$, $0 \le c \le 0.5$ and $0 \le d \le 0.3$, respectively; (c) the second layer being made of AlCrN or AlCrDN [provided that D includes either one kind of elements of a Group IVa, a Group Va and a Group VIa (except Cr) of a Periodic Table of Elements and Y, or SiC (silicon carbide)]; and (d) the third layer being made of nitride, carbon nitride or carbide of metals including elements of one kind or more kinds of Al, Ti, Zr, Hf, V, Nb, Ta, Cr and W.

The second aspect of the invention provides the hard coating film recited in the first aspect of the invention, wherein (a) a mixed layer of the first and second layers having both compositions of the first and second layers is formed in a boundary portion between both layers by switching forming treatments of the first and second layers at shifted timings such that the forming treatments are in duplication for a predetermined time interval; and (b) a mixed layer of the second and third layers having both compositions of the second and third layers is formed in a boundary portion between both layers by switching forming treatments of the second and third layers at shifted timings such that the forming treatments are in duplication for a predetermined time interval.

The third aspect of the invention provides the hard coating film recited in the first or second aspect of the invention, wherein (a) a total film thickness Ttotal of the first layer, the second layer and the third layer lies in a range of 0.05 to 15 μm; (b) a film thickness T1 of the first layer lies in a range of 1 to 50% of the total film thickness Ttotal; (c) a film thickness T3 of the third layer lies in a range of 1 to 25% of the total film thickness Ttotal; and (d) a film thickness T2 of the second layer lies in a value of (Ttotal−T1−T3).

The fourth aspect of the invention relates to a hard coating film coated working tool including a tool base material of which surface is coated with the hard coating film in any of the first to third aspects of the invention.

Effect of the Invention

With a hard coating film of a first aspect of the present invention, a second layer is made of AlCrN or AlCrDN [provided that D includes either one kind of elements of a Group IVa, a Group Va and a Group VIa (except Cr) of a Periodic Table for Elements and Y, or SiC (silicon carbide)], by which excellent wear resistance is obtained. A first layer is provided at the uppermost layer and made of $(Cr_{1-a-b}B_a(SiC)_b)$ $(C_cO_dN_{1-c-d})$ [provided that SiC is silicon carbide, and a, b, c and d are atomic ratios in ranges of $0 \le a \le 0.2$, $0.01 \le b \le 0.2$, $0 \le c \le 0.5$ and $0 \le d \le 0.3$, respectively], by which excellent adhesion resistance is obtained. A third layer, intervened between a predetermined member, such as a tool base material or the like on which the hard coating film is to be formed, and the second layer, is made of nitride, carbon nitride or carbide of metals including elements of one kind or more kinds of Al, Ti, Zr, Hf, V, Nb, Ta, Cr and W, by which increased bonding strength is obtained. This allows excellent wear resistance and adhesion resistance to be stably obtained over an extended period of time. In case of, for instance, a hard coating film coated machining tool as defined by a fourth aspect of the present invention, the occurrence of peel-off and wear due to chipping can be suppressed and a favorable work surface is obtained even when performing cutting work on stainless steel or when performing cutting work on a workpiece material which has likelihood of adhesion and whose hardness is 50HRC or less. Further, this results in a capability of obtaining predetermined cutting performance with a resultant increase in tool life. In particular, since the first layer, formed at the uppermost layer, includes SiC (silicon carbide), a surface hardness increases (to a level of, for instance, 3000 HV or more), then due to the increased surface hardness as well as adhesion resistance and bonding strength a remarkable increase in wear resistance is obtained. This provides an excellent wear-resistance increasing effect especially when cutting work is performed on the workpiece material with high hardness.

According to a second aspect of the present invention, a mixed layer of both of the first and second layers is formed in a boundary portion between such layers and a mixed layer of both of the second and third layers is formed in a boundary portion between such layers. This result in an increase in mutual bonding strength among the first, second and third layers with a resultant further enhanced effect of suppressing the occurrence of peel-off and wear due to chipping. When the first to third layers are formed by a PVD method such as an arc ion plating method and a sputtering method or the like, forming the first to third layers including such mixed layers can be formed continuously and efficiently by appropriately determining timing for targets and/or reaction gases to be switched such that the mixed layers are formed.

According to a third aspect of the present invention, a total film thickness Ttotal of the first to third layers lies in a range of 0.05 to 15 μm, in which: a film thickness T1 of the first layer lies in a range of 1 to 50% of the total film thickness Ttotal; a film thickness T3 of the third layer lies in a range of 1 to 25% of the total film thickness Ttotal; and a film thickness T2 of the second layer lies in a value of (Ttotal−T1−T3). This allows various effects to be obtained including improvement in adhesion resistance by the first layer, improvement in wear resistance by the second layer and improvement in bonding strength by the third layer.

BRIEF DESCRIPTION OF THE DRAWINGS

FIGS. 1(a) to 1(c) are views illustrating an end mill, to which the present invention is applied, and FIG. 1(a) is a front view viewed in a direction perpendicular to an axis while FIG. 1(b) is an enlarged bottom view viewed from a leading end and FIG. 1(c) is an enlarged cross sectional view of the vicinity of a surface of the cutting portion provided with the hard coating film.

EXPLANATION OF SIGNS

10: end mill (hard coating film coated working tool) 12: tool base material (predetermined member) 20: hard coating film 22: first layer 24: second layer 26: third layer

BEST MODE FOR CARRYING OUT THE INVENTION

The present invention can be preferably applied to a hard coating film, formed on surfaces of various working tools such as rotary cutting tools like an end mill, a tap and a drill, etc., and, in addition, a non-rotary type cutting tool such as a turning tool or the like or a rolling tool or the like. The present invention can also be applied to a hard coating film which is formed on a surface of a member aside from the cutting tools, for example, a surface protective film of a semiconductor device or the like. Means for forming the hard coating film may preferably include a PVD (Physical Vapor Deposition) method such as an arc ion plating method, a sputtering method, or the like.

According to the second aspect of the present invention, although the mixed layer of the first and second layers is formed in the boundary portion between both layers and the mixed layer of the second and third layers is formed in the boundary portion between both layers, no mixed layers can be provided. The first layer may be directly formed on the second layer and the second layer may be directly formed on the third layer. The mixed layer may be provided only in either one of the boundary portion between the first and second layers and the boundary portion between the second and third layers.

According to the third aspect of the present invention, the total film thickness Ttotal lies in the range of 0.05 to 15 μm. If the total thickness Ttotal is less than 0.05 μm, then, it becomes difficult to obtain the hard coating film with adequate performance and if the total thickness Ttotal exceeds 15 μm, then, a cutting chip of the cutting tool is rounded or the like with resultant likelihood of deterioration caused in tool performance. The film thickness T1 of the first layer lies in the range of 1 to 50% of the total film thickness Ttotal. If the film thickness T1 is less than 1%, then, an adhesion-resistance improving effect of the first layer can not be adequately obtained and if the film thickness T1 exceeds 50%, then, it is likely that deterioration occurs in improvement of wear resistance of the second layer. In addition, the film thickness T3 of the third layer lies in the range of 1 to 25% of the total film thickness Ttotal. If the film thickness T3 is less than 1%, then, a bonding-strength improving effect of the third layer can not be adequately obtained and if the film thickness T3 exceeds 25%, then, it is likely that deterioration occurs in a wear-resistance improving effect of the second layer.

Examples of a tool base material for the hard coating film coated working tool may preferably include cemented carbide, high-speed tool steel, cermet, ceramics, polycrystalline diamond (PCD), monocrystalline diamond, polycrystalline CBN and monocrystalline CBN or the like but other tool base materials may be possible to be adopted.

Embodiment

Hereunder, an embodiment of the present invention will be described below in detail with reference to the accompanying drawings.

Figures 1A, 1B:
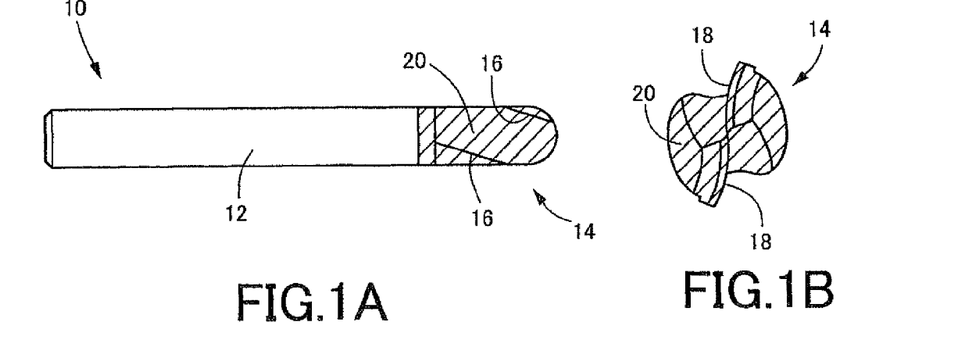
Figure 1C:
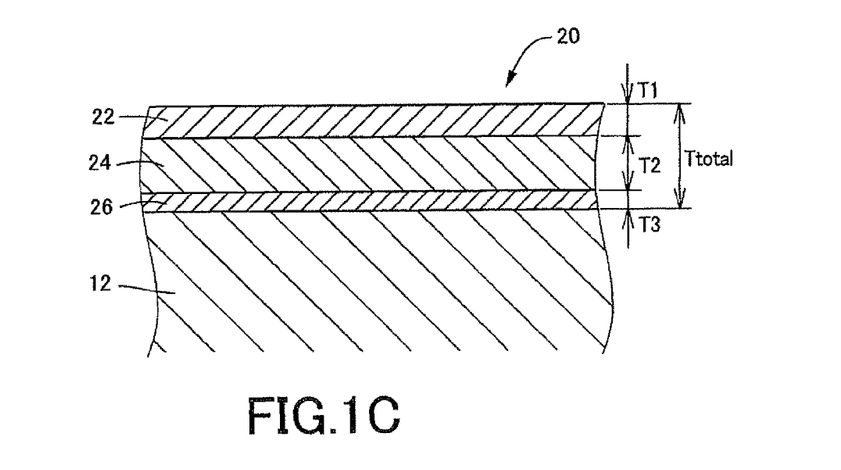

FIGS. 1(a) to 1(c) are views illustrating a ball end mill 10 representing one example of a hard coating film coated working tool, to which the present invention is applied, and FIG. 1(a) is a front view viewed in a direction perpendicular to an axis while FIG. 1(b) is an enlarged bottom view viewed from a leading end (a right side in FIG. 1(a)). A tool base material 12, made of cemented carbide, includes a shank and a cutting portion 14 both of which are integrally formed. The cutting portion 14 includes cutting edges in the form of a pair of outer peripheral blades 16 and a pair of ball blades 18 which are symmetrically formed with respect to the axis such that, when drivably rotated about the axis, the outer peripheral blades 16 and the ball blades 18 perform cutting operations. The cutting portion 14 has a surface coated with a hard coating film 20. A shaded portion in FIG. 1(*a*) represents the hard coating film 20 and FIG. 1(*c*) is a cross sectional view of the vicinity of a surface of the cutting portion 14 coated with the hard coating film 20. The ball end mill 10 is a rotary cutting tool and the tool base material 12 corresponds to a predetermined member on which the hard coating film 20 is provided.

Figure 2:
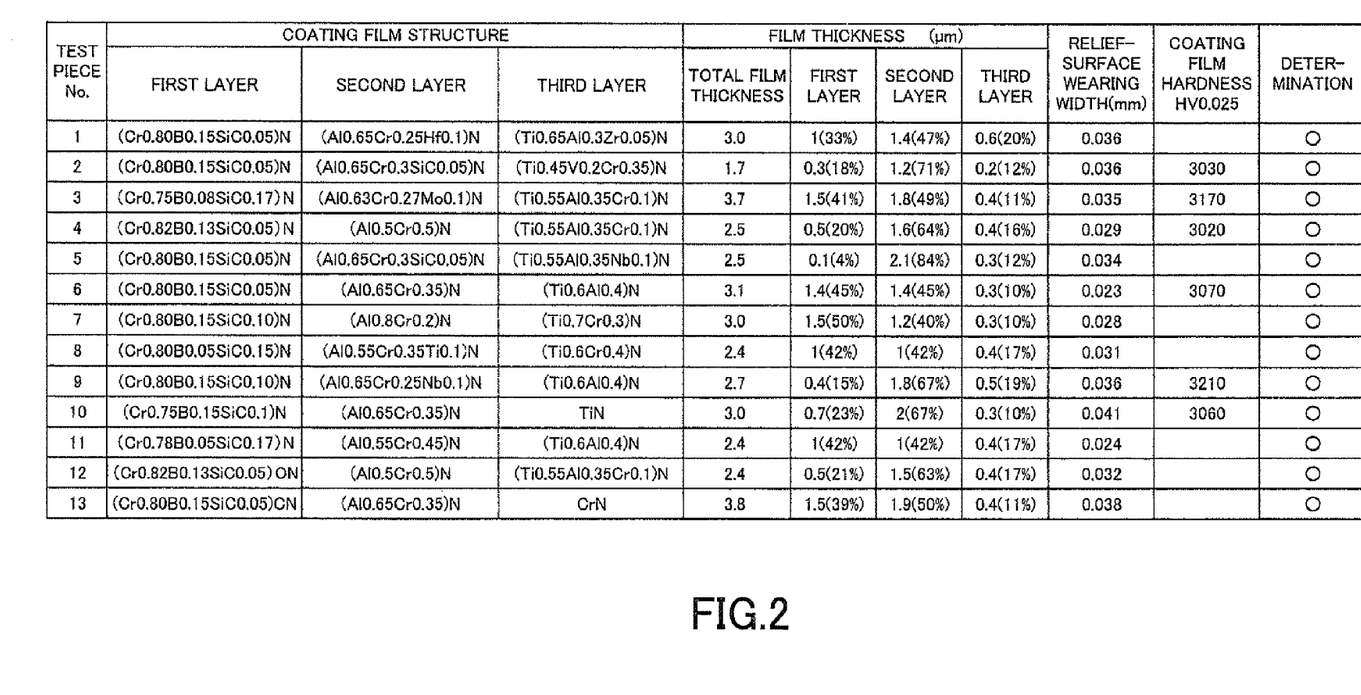
FIG. 2 is a view showing concrete examples of the hard coating films of the present invention, provided on end mills described in FIG. 1, and results obtained by checking relief-surface wearing widths (wear resistances) of the end mills after conducting cutting works under predetermined conditions using such end mills.

As will be clear from FIG. 1(*c*), the hard coating film 20 takes the form of a three-layer structure, including a first layer 22, a second layer 24 and a third layer 26, which are continuously formed by switching targets and reaction gases upon using an arc ion-plating device in the illustrated embodiment. The third layer 26, formed on a surface of the tool base material 12 in contact therewith, is made of nitride, carbon nitride or carbide of metals including elements of one kind or more kinds of Al, Ti, Zr, Hf, V, Nb, Ta, Cr and W. As exemplarily shown in a column, for instance, "THIRD LAYER" of "COATING FILM STRUCTURE" in FIG. 2, more particularly, examples include TiN, CrN, TiAlN, TiCrN, TiAlNbN, TiAlZrN, TiAlCrN and TiVCrN, etc. Also, a small number, described after each element on column "COATING FILM STRUCTURE" in FIG. 2, represents an atomic ratio. This similarly applies to FIG. 3.

The second layer 24, provided on the third layer 26, is made of AlCrN or AlCrDN [provided that D includes either one kind of elements of a Group IVa, a Group Va and a Group VIa (except Cr) of a Periodic Table of Elements and Y, or SiC (silicon carbide)]. As exemplarily shown in a column, for instance, "SECOND LAYER" of "COATING FILM STRUCTURE" in FIG. 2, more particularly, examples include AlCrN, AlCrHfN, AlCr(SiC)N or AlCrNbN, AlCrMoN, and AlCrTiN, etc. A boundary portion between the second layer 24 and the third layer 26 is provided with a mixed layer, containing both of such compositions in a mixture with a slight amount of thickness (of, for instance, 10% or less of a film thickness T2 of the second layer 24), which is not shown in the drawing. The mixed layer can be formed contiguously to the third layer 26 by switching a target and reaction gas for forming the third layer 26 and a target and reaction gas for forming the second layer 24 at shifted timings such that using the target and reaction gas for forming the third layer 26 and the target and reaction gas for forming the second layer 24 in duplication for a predetermined time interval. In addition, under such a condition if the energization (arc discharge) to the target for forming the third layer 26 and the supply of reaction gas are interrupted, the mixed layer can be switched to the second layer 24 to be contiguously formed. Also, in case of using common reaction gas, the targets to be energized may be merely switched in operation.

The first layer 22, i.e., the uppermost layer being formed on the second layer 24 and forming the surface of the hard coating film 20, is made of $(Cr_{1-a-b}B_a(SiC)_b)(C_cO_dN_{1-c-d})$ [provided that SiC is silicon carbide, and a, b, c and d represent atomic ratios in ranges of $0 \leq a \leq 0.2$, $0.01 \leq b \leq 0.2$, $0 \leq c \leq 0.5$ and $0 \leq d \leq 0.3$, respectively]. As exemplarily shown in a column, for instance, "FIRST LAYER" of "COATING FILM STRUCTURE" in FIG. 2, more particularly, examples include CrB(SiC)N, CrB(SiC)ON and CrB(SiC)CN, etc. A boundary portion between the first layer 22 and the second layer 24 is provided with a mixed layer, including both of such compositions with a slight amount of thickness (of, for instance, 10% or less of a film thickness T1 of the first layer 22), which is not shown in the drawing. The mixed layer can be contiguously formed in the same way as the mixed layer formed at the boundary portion between the second layer 24 and the third layer 26.

Figure 3:
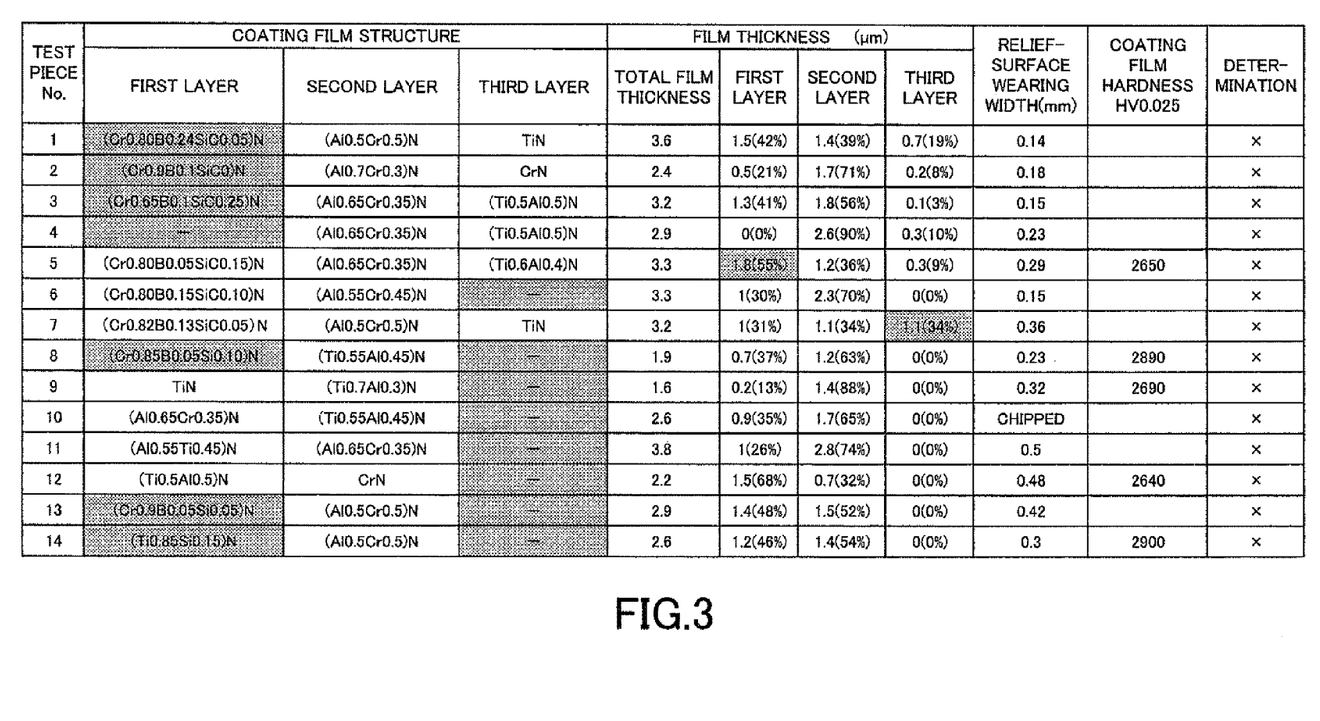
FIG. 3 is a view showing results obtained by checking relief-surface wearing widths (wear resistances) of comparative examples, which are different from the present invention in atomic ration of the first layers and film thicknesses, etc., under the same cutting conditions as those of FIG. 2.

Further, a total film thickness Ttotal of a whole of the hard coating film 20, formed of the first layer 22, the second layer 24 and the third layer 26 in combination, lies in a range of 0.05 to 15 μm. A film thickness T1 of the first layer 22 lies in a range of 1 to 50% of the total film thickness Ttotal; a film thickness T3 of the third layer 26 lies in a range of 1 to 25% of the total film thickness Ttotal; and a film thickness T2 of the second layer 24 lies in a value of (Ttotal−T1−T3). Each value with the mark "%", described in parentheses in columns on the film thickness in FIGS. 2 and 3, represents ratios with respect to the total film thickness Ttotal.

With a hard coating film 20 of a ball end mill 10 in the embodiment as such, a second layer 24 is made of AlCrN or ALCrDN by which excellent wear resistance is obtained. A first layer 22 is provided at the uppermost layer and made of $(Cr_{1-a-b}B_a(SiC)_b)(C_cO_dN_{1-c-d})$ by which excellent adhesion resistance is obtained. A third layer 26, intervened between a tool base material 12 and the second layer 24, is made of nitride, carbon nitride or carbide of metals including elements of one kind or more kinds of Al, Ti, Zr, Hf, V, Nb, Ta, Cr and W by which increased bonding strength is obtained. This allows excellent wear resistance and adhesion resistance to be stably obtained over an extended period of time. The occurrence of peel-off and wear due to chipping can be suppressed even when performing cutting work on stainless steel or when performing cutting work on a workpiece material with likelihood of adhesion caused under hardness of 50 HRC or less. This results in a capability of obtaining a favorable work surface while making it possible to stably obtain predetermined cutting performance with a resultant increase in tool life.

In particular, since the first layer 22, formed at the uppermost layer, includes SiC (silicon carbide), a surface hardness increases to a level (of, for instance, 3000 HV or more) with resultant improvements in wear resistance and bonding strength accompanied by a remarkable increase in wear resistance. This provides an excellent wear-resistance increasing effect especially when cutting work is performed on the workpiece material with increased hardness.

According to the embodiment, a boundary portion between the first and second layers 22, 24 is formed in a mixed layer of both of such layers and a boundary portion between the second and third layers 24, 26 is formed in a mixed layer of both of such layers. This result in an increase in mutual bonding strength among the first, second and third layers 22, 24 and 26 with a resultant further enhanced effect of suppressing the occurrence of peel-off and wear due to chipping. In the embodiment, so that the first to third layers 22-26 are formed by an arc ion plating method, further, appropriately determining timing for targets and reaction gases to be switched such that the mixed layers are formed results in a capability of continuously and efficiently forming the first to third layers 26-22 including such mixed layers.

According to the embodiment, a total film thickness Ttotal of the first to third layers 22-26 lies in a range of 0.05 to 15 μm in which: a film thickness T1 of the first layer 22 lies in a range of 1 to 50% of the total film thickness Ttotal; a film thickness T3 of the third layer 26 lies in a range of 1 to 25% of the total film thickness Ttotal; and a film thickness T2 of the second layer 24 lies in a value of (Ttotal−T1−T3). This allows various effects to be appropriately obtained including improvement in adhesion resistance of the first layer 22, improvement in wear resistance of the second layer 24 and improvement in bonding strength of the third layer 26.

Next, two-blade type ball end mills 10 (corresponding to present invention products that satisfy requirements of claims 1 to 3) of the present embodiment, including the tool base materials 12 made of cemented carbide and having a diameter of 6 mm (with a tip radius R=3), and comparative products unsatisfying the requirements of claim 1 or 3, in existences, components, atomic ratios, and thicknesses of the first layer 22, the second layer 24 and the third layer 26 which form the hard coating films 20 were prepared. Then, cutting works were conducted under test conditions described below, to perform cutting works in length of 210 m and resulting relief-surface (flank-surface) wearing widths (mm) of the ball blades 18 were checked and described below. All items in FIG. 2 represent products of the present invention products and all items in FIG. 3 represent the comparative products where hatched cells in FIG. 3 represent the items that do not satisfy the requirements of claim 1 or 3. In addition, pass/fail determinations were made on criteria with the relief-surface wearing widths (mm) taken in averaged values of the two ball blades 18 with allowable ranges being set to 0.1 mm or less. Moreover, since it was not necessarily easy to measure coating film hardness (HV 0.025), the checking was conducted on some test pieces and measurements of those were omitted for test pieces with no description.

(Test Condition)
Work Material: SUS304 (Stainless Steel under HS Standard)
Cutting Method Pick Cutting
Cutting Speed: 217 m/min
Feed Rate: 0.12 mm/t
Depth of Cut: aa=0.3 mm, and Pf=0.6 mm
Cutting Fluid: Air Blow The present invention products, shown in FIG. 2, had the relief-surface wearing widths all of which remained within an allowable range (of 0.1 mm or less). On the contrary, the comparative products, shown in FIG. 3, had the relief-surface wearing widths all of which exceeded the allowable range (of 0.1 mm) or chipping occurred in the course of cutting work and had a difficulty in performing cutting work, that is, no adequate durability (tool life) was obtained. Coating film hardnesses HV of the present invention products, shown in FIG. 2 were in a range ranging from 3020 to 3210, and those of the comparative products shown in FIG. 3 were in a range ranging from 2640 to 2900. The present invention products, having the first layer 22 at the uppermost layer containing SiC (silicon carbide), had an increase in coating film hardness HV, and due to the increased coating film hardness HV as well as improved adhesion resistance and bonding strength durability is increased remarkably.

Figure 4:
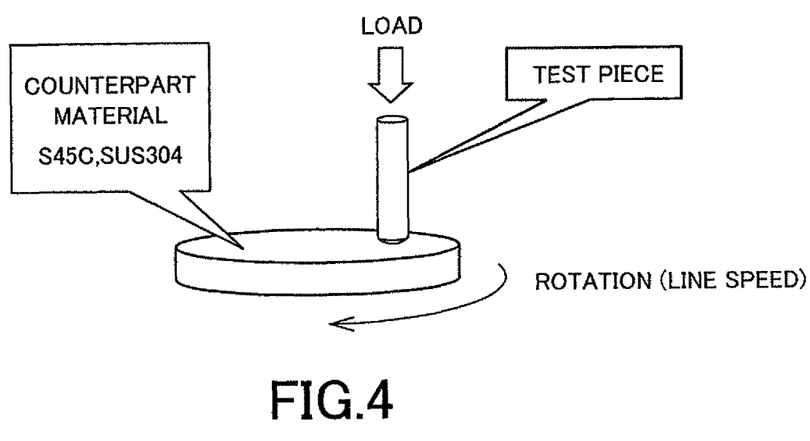
FIG. 4 is a conceptual view illustrating a pin-on-disk type friction test machine used when conducting friction wear tests with the use of test pieces provided with predetermined hard coating films.

These test pieces have columnar shapes each with a diameter of 6 mm and each apex rapping surface being formed in a spherical surface of R5. Further, two pieces of test pieces, each of them having a rapping surface coated with the hard coating film 20 of the present invention and two pieces of test pieces, each of them having a rapping surface coated with hard coating film of a single layer composed of only AlCrN of the related art are prepared respectively. Then, friction wear tests were conducted by using a pin-on-disk type test machine shown in FIG. 4 under test conditions described below results (photographs on wear marks), shown in FIGS. 5 and 6, were obtained. The hard coating film 20 of the present invention, employed in this case, was identical to that shown in test piece No. 6 in FIG. 2, had the first layer 22 composed of $Cr_{0.80}B_{0.15}(SiC)_{0.05}N$, the second layer 24 composed of $Al_{0.65}Cr_{0.35}N$ and the third layer 26 composed of $Ti_{0.6}Al_{0.4}N$ with a total film thickness Ttotal of 3.1 µm wherein: the first layer 22 had a film thickness T1=1.4 µm (45%); the second layer 24 had a film thickness T2=1.4 µm (45%); and the third layer 26 had a film thickness T3=0.3 µm (10%).

(Test Condition)
Counterpart Material: S45C (Carbon Steel under JIS Standard) and SUS304 (Stainless Steel under JIS Standard)
Load: 0.5N
Line Speed: 25 mm/s
Time: 300 s
Room Temperature: 22° C.
Humidity: 39%

Figure 5A:
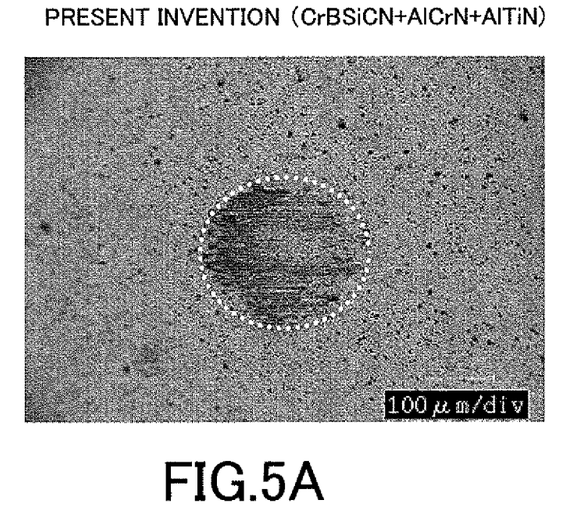
FIG. 5 shows photographs on wear marks of a hard coating film of the present invention and a hard coating film of the related art resulting from the friction wear tests conducted on materials made of S45C using the device shown in FIG. 4.
Figure 5B:
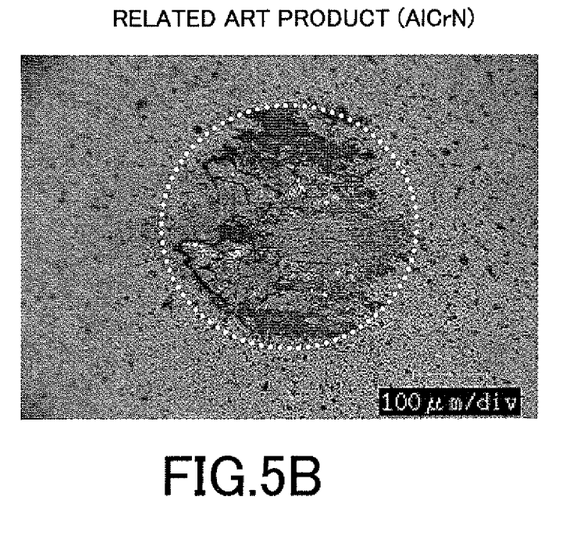
Figure 6A:
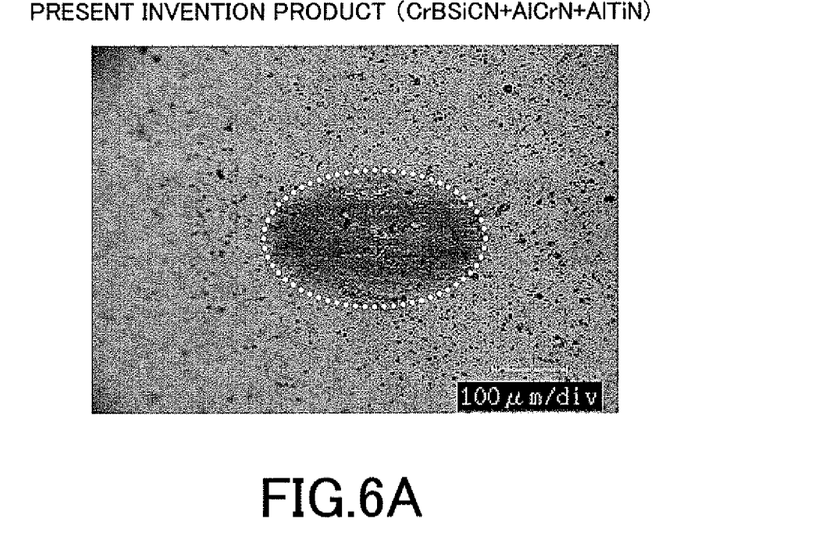
FIG. 6 shows photographs on wear marks of a hard coating film of the present invention and a hard coating film of the related art resulting from the friction wear tests conducted on the materials made of SUS304 using the device shown in FIG. 4.
Figure 6B:
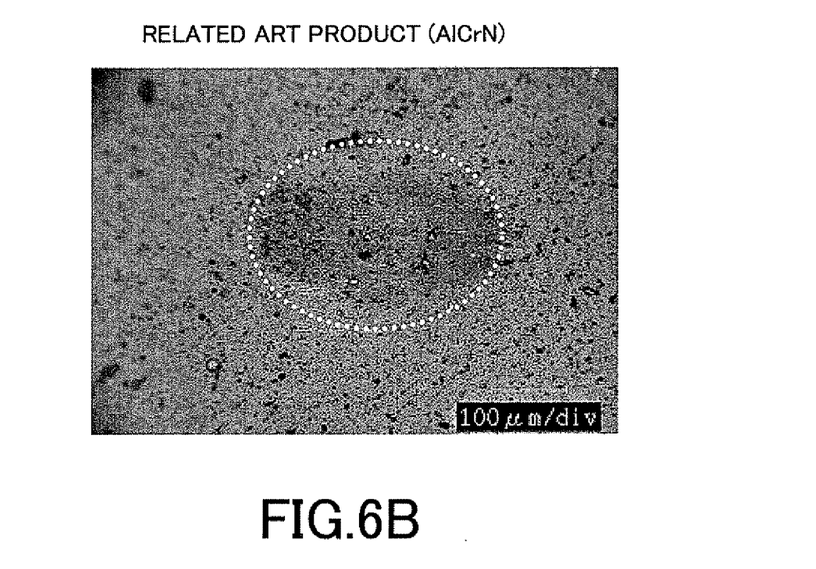

FIG. 5 shows a case in which a counterpart material was made of S45C and FIG. 6 shows a case in which the counterpart material was made of SUS304, where wear marks are shown in regions surrounded by white dotted lines respectively it is understood that the present invention test pieces had smaller wear marks than those of the related art test pieces respectively and that the present invention products have more excellent wear resistance. Particularly, in FIG. 5 where the counterpart material is made of S45C, concerning to related art test piece of FIG. 5(*b*) adhesion of the counterpart material to the test piece and peel-off of the coating film are found. In contrast, concerning to the present invention test piece of FIG. 5(*a*) almost no such adhesion and peel-off occur, and then excellent wear resistance and bonding strength are obtained.

Although the embodiments of the invention have been described in detail with reference to the drawings, the embodiments are merely examples, and the invention can be implemented in various forms obtained by altering or modifying the embodiments based on the knowledge of those skilled in the art.

INDUSTRIAL UTILIZATION

With a hard coating film of the present invention, a second layer is made of AlCrN or AlCrDN by which excellent wear resistance is obtained. A first layer is provided at the uppermost layer and made of $(Cr_{1-a-b}B_a(SiC)_b)(C_cO_dN_{1-c-d})$ by which excellent adhesion resistance is obtained. A third layer, intervened between a tool base material and the second layer, is made of nitride, carbon nitride or carbide of metals including elements of one kind or more kinds of Al, Ti, Zr, Hf, V, Nb, Ta, Cr and W by which increased bonding strength is obtained. This allows excellent wear resistance and adhesion resistance to be stably obtained over an extended period of time. The occurrence of peel-off and wear due to chipping can be suppressed even when performing cutting work on stainless steel or when performing cutting work on a workpiece material with likelihood of adhesion. This results in such as a capability of obtaining a favorable work surface while making it possible to stably obtain predetermined cutting performance. It is preferably adopted as the hard coating film of the cutting tools or the like for cutting work.

The invention claimed is:
1. A hard coating film formed on a surface of a predetermined member and having excellent wear resistance and adhesion resistance, the hard coating film comprising:
a three-layer structure composed of a third layer formed in contact with the surface of the predetermined member, a second layer formed on the third layer, and a first layer formed on the second layer to constitute the uppermost layer;
the first layer being made of $(Cr_{1-a-b}B_a(SiC)_b)(C_cO_dN_{1-c-d})$ wherein SiC is silicon carbide, and a, b, c and d are atomic ratios in ranges of $0 \leq a \leq 0.2$, $0.01 \leq b \leq 0.2$, $0 \leq c \leq 0.5$ and $0 \leq d \leq 0.3$, respectively;

the second layer being made of AlCrN or AlCrDN wherein D is selected from the group consisting of either one element of Group IVa, Group Va and Group VIa, except Cr, of the Periodic Table of Elements and Y, or SiC (silicon carbide); and the third layer being made of nitride, carbon nitride or carbide of metals including of one element or more elements of Al, Ti, Zr, Hf, V, Nb, Ta, Cr and W.

2. A working tool including the predetermined member coated with the hard coating film of claim 1.

3. The hard coating film according to claim 1, wherein:
a total film thickness Ttotal of the first layer, the second layer and the third layer has a value within a range of 0.05 to 15 μm;
a film thickness T1 of the first layer has a value within a range of 1 to 50% of the total film thickness Ttotal;
a film thickness T3 of the third layer has a value within a range of 1 to 25% of the total film thickness Ttotal; and
a film thickness T2 of the second layer has a value of (Ttotal−T1−T3).

4. A working tool including the predetermined member coated with the hard coating film of claim 3.

5. The hard coating film according to claim 1, wherein:
a mixed layer of the first and second layers having both compositions of the first and second layers is formed in a boundary portion between both layers by switching forming treatments of the first and second layers at shifted timings such that the forming treatments are in duplication for a predetermined time interval; and
a mixed layer of the second and third layers having both compositions of the second and third layers is formed in a boundary portion between both layers by switching forming treatments of the second and third layers at shifted timings such that the forming treatments are in duplication for a predetermined time interval.

6. The hard coating film according to claim 5, wherein:
a total film thickness Ttotal of the first layer, the second layer and the third layer has a value within a range of 0.05 to 15 μm;
a film thickness T1 of the first layer has a value within a range of 1 to 50% of the total film thickness Ttotal;
a film thickness T3 of the third layer has a value within a range of 1 to 25% of the total film thickness Ttotal; and
a film thickness T2 of the second layer has a value of (Ttotal−T1−T3).

7. A working tool including the predetermined member coated with the hard coating film of claim 5.

* * * * *